(12) United States Patent
Matsukura et al.

(10) Patent No.: US 12,651,732 B2
(45) Date of Patent: Jun. 9, 2026

(54) APPARATUS DIAGNOSTIC APPARATUS, SEMICONDUCTOR MANUFACTURING APPARATUS SYSTEM, AND SEMICONDUCTOR APPARATUS MANUFACTURING SYSTEM

(71) Applicant: Hitachi High-Tech Corporation, Tokyo (JP)

(72) Inventors: Satoru Matsukura, Tokyo (JP); Yoshito Kamaji, Hsinchu (TW); Nanako Tamari, Tokyo (JP); Akira Kagoshima, Tokyo (JP); Masahiro Sumiya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 412 days.

(21) Appl. No.: 18/027,200

(22) PCT Filed: Jan. 25, 2022

(86) PCT No.: PCT/JP2022/002602
§ 371 (c)(1),
(2) Date: Mar. 20, 2023

(87) PCT Pub. No.: WO2023/144874
PCT Pub. Date: Aug. 3, 2023

(65) Prior Publication Data
US 2024/0339308 A1 Oct. 10, 2024

(51) Int. Cl.
H01J 37/32 (2006.01)
G05B 19/418 (2006.01)
H10P 72/00 (2026.01)

(52) U.S. Cl.
CPC .. H01J 37/32926 (2013.01); H01J 37/32935 (2013.01); H10P 72/0604 (2026.01)

(58) Field of Classification Search
None
See application file for complete search history.

(56) References Cited

U.S. PATENT DOCUMENTS

| | | | |
|---|---|---|---|
| 7,505,879 B2 * | 3/2009 | Tomoyasu | H01J 37/32935 700/109 |
| 8,173,451 B1 * | 5/2012 | Tian | H01J 37/32917 156/345.24 |

(Continued)

FOREIGN PATENT DOCUMENTS

| | | |
|---|---|---|
| JP | 2002-270581 A | 9/2002 |
| JP | 2003-077780 A | 3/2003 |

(Continued)

OTHER PUBLICATIONS

Machine Generated English Translation of description of JP2002270581. Published Sep. 20, 2002 (Year: 2002).*

(Continued)

*Primary Examiner* — Sylvia MacArthur
(74) *Attorney, Agent, or Firm* — Miles & Stockbridge, P.C.

(57) ABSTRACT

An apparatus diagnostic apparatus that performs a computation process using data acquired from a semiconductor apparatus manufacturing apparatus having a reference chamber to create reference chamber feature quantity map data by mapping a feature quantity onto a graph having axes representing a plurality of parameters. The apparatus diagnostic apparatus also performs a computation process using data acquired from a semiconductor apparatus manufacturing apparatus having a calibration-target chamber to create calibration-target chamber feature quantity map data by mapping a feature quantity onto a graph having axes representing a plurality of parameters. Based on patterns observed in the reference chamber feature quantity map data and the calibration-target chamber feature quantity map (Continued)

data, the apparatus diagnostic apparatus identifies a performance difference between different chambers, a performance difference resulting from a temporal change of a single chamber, or a performance difference resulting from component replacement or component cleaning of a single chamber.

10 Claims, 10 Drawing Sheets

(56)                     References Cited

U.S. PATENT DOCUMENTS

| | | | |
|---|---|---|---|
| 9,972,478 B2 * | 5/2018 | Guha ................ | H01L 21/67069 |
| 10,197,908 B2 * | 2/2019 | Sriraman .................. | G03F 1/70 |
| 2003/0132195 A1 * | 7/2003 | Edamura ........... | H01J 37/32935 |
| | | | 156/345.24 |
| 2003/0154052 A1 | 8/2003 | Samata et al. | |
| 2004/0049898 A1 * | 3/2004 | Imai ........................ | H01L 22/20 |
| | | | 118/712 |
| 2005/0095774 A1 | 5/2005 | Ushiku et al. | |
| 2007/0012660 A1 * | 1/2007 | Lewington ........ | H01L 21/67742 |
| | | | 216/60 |
| 2007/0155185 A1 | 7/2007 | Rauf | |
| 2016/0216185 A1 * | 7/2016 | Gottscho ............ | H01J 37/3299 |
| 2017/0095865 A1 | 4/2017 | Caldicott | |
| 2020/0110390 A1 * | 4/2020 | Banna ............... | H01L 21/67253 |
| 2024/0339308 A1 * | 10/2024 | Matsukura ........... | G05B 19/418 |

FOREIGN PATENT DOCUMENTS

| | | | |
|---|---|---|---|
| JP | 2005109437 A | | 4/2005 |
| JP | 2009-295658 A | | 12/2009 |
| JP | 2011-238769 A | | 11/2011 |
| JP | 2013-135044 A | | 7/2013 |
| JP | 2014-022695 A | | 2/2014 |
| JP | 2018-533196 A | | 11/2018 |

OTHER PUBLICATIONS

Machine Generated English Translation of bibliography of JP2002270581. Published Sep. 20, 2002 (Year: 2002).*
Machine Generated English Translation of claims of JP2002270581. Published Sep. 20, 2002 (Year: 2002).*
Machine Generated English Translation of description of JP2011238769. Published Nov. 24, 2011. (Year: 2011).*
Machine Generated English Translation of bibliography of JP2011238769. Published Nov. 24, 2011. (Year: 2011).*
Machine Generated English Translation of claims of JP2011238769. Published Nov. 24, 2011. (Year: 2011).*
Search Report mailed Apr. 5, 2022 in International Application No. PCT/JP2022/002602.
Office Action mailed Aug. 2, 2023 in Taiwanese Application No. 111149948.

* cited by examiner

3DMP

*FIG. 8*

APPARATUS DIAGNOSTIC APPARATUS, SEMICONDUCTOR MANUFACTURING APPARATUS SYSTEM, AND SEMICONDUCTOR APPARATUS MANUFACTURING SYSTEM

TECHNICAL FIELD

The present invention relates to an apparatus diagnostic apparatus, a semiconductor manufacturing apparatus system, and a semiconductor apparatus manufacturing system that make a diagnosis of a semiconductor processing apparatus. In particular, the present invention relates to a state monitoring and prediction system for a semiconductor processing apparatus (semiconductor apparatus manufacturing apparatus) by an apparatus diagnostic apparatus, and, by performing a computation process using data acquired from the semiconductor apparatus manufacturing apparatus, can be applied to a technology of identifying a performance difference resulting from a temporal change of a single processing chamber (called a chamber), a performance difference resulting from component replacement or component cleaning of a single chamber or a performance difference between different chambers, or a technology of identifying or calibrating such performance differences.

BACKGROUND ART

In a semiconductor apparatus manufacturing apparatus, performance variations of semiconductor apparatuses occur due to time-related factors. In addition, replacement of consumable components and cleaning of components of the manufacturing apparatus also become factors of state changes of chambers to cause performance variations of semiconductor apparatuses.

As a solution for the problem described above, Japanese Unexamined Patent Application Publication (Translation of PCT Application) No. 2018-533196, Japanese Patent Application Laid-Open No. 2014-22695, Japanese Patent Application Laid-Open No. 2009-295658, and the like are proposed.

CITATION LIST

Patent Literatures

PTL 1: Japanese Unexamined Patent Application Publication (Translation of PCT Application) No. 2018-533196

PTL 2: Japanese Patent Application Laid-Open No. 2009-295658

PTL 3: Japanese Patent Application Laid-Open No. 2014-22695

SUMMARY OF INVENTION

Technical Problem

Japanese Unexamined Patent Application Publication (Translation of PCT Application) No. 2018-533196 proposes an inter-chamber difference calibration system, and does not mention specific calibration algorithms. Japanese Patent Application Laid-Open No. 2009-295658 proposes a calibration method using plasma emission intensity or plasma density, but does not mention a technique of identifying an actual inter-chamber difference. Japanese Patent Application Laid-Open No. 2014-22695 proposes a calibration method using plasma emission intensity and a radio-frequency power-supply peak-to-peak voltage Vpp, but, in a case that calibration of a plurality of parameters is performed, it is necessary to simultaneously identify inter-chamber differences for a plurality of parameters, and Japanese Patent Application Laid-Open No. 2014-22695 does not mention the point. In addition, since selection of the type of a sensor used for calibration depends on a factor based on the rule of thumb of a skilled engineer, and the calibration cannot be said to be an optimal solution.

Solution to Problem

Regarding a state monitoring and prediction system for a semiconductor apparatus manufacturing apparatus, an apparatus diagnostic apparatus that identifies a performance difference between different chambers, a performance difference resulting from a temporal change of a single chamber or a performance difference resulting from component replacement, or component cleaning of a single chamber makes a diagnosis of an apparatus state of a second semiconductor apparatus manufacturing apparatus by an algorithm including:

a) at a first semiconductor apparatus manufacturing apparatus or the second semiconductor apparatus manufacturing apparatus treated as a reference chamber, a first step of collecting data related to a plasma generation situation by using various types of sensors mounted on the first semiconductor apparatus manufacturing apparatus or the second semiconductor apparatus manufacturing apparatus having the reference chamber while plasma is generated with a plurality of changed manufacturing condition parameters;

a second step of applying a computation process on the collected data, and calculating a plurality of representative values of the plasma generation situation under the conditions of the plurality of manufacturing condition parameters;

a third step of performing a computation process by using the plurality of representative values, and calculating feature quantities; and a fourth step of mapping the feature quantities onto a graph with two or more dimensions having axes representing the plurality of manufacturing condition parameters, and create reference chamber feature quantity map data (D107);

b) at the second semiconductor apparatus manufacturing apparatus having a chamber which is a calibration target of the performance difference between the different chambers, the reference chamber after the temporal change which is a calibration target of the performance difference resulting from the temporal change of the single chamber, or the reference chamber after the component replacement or the component cleaning which is a calibration target of the performance difference resulting from the component replacement or the component cleaning of the single chamber, a fifth step of collecting data related to a plasma generation situation by using various types of sensors mounted on the second semiconductor apparatus manufacturing apparatus having the chamber which is the target of calibration or the reference chamber having undergone the temporal change while plasma is generated with a plurality of changed manufacturing condition parameters;

a sixth step of applying a computation process to the collected data, and calculating a plurality of representative values of the plasma generation situation under the conditions of the plurality of manufacturing condition parameters;

a seventh step of performing a computation process by using the plurality of representative values, and calculating feature quantities;

an eighth step of mapping the feature quantities onto a graph with two or more dimensions having axes representing the plurality of manufacturing condition parameters, and creating calibration-target chamber feature quantity map data (D112); and c) a ninth step of, on the basis of patterns observed in the reference chamber feature quantity map data and the calibration-target chamber feature quantity map data, identifying the performance difference between different chambers, the performance difference resulting from the temporal change of the single chamber, or the performance difference resulting from the component replacement or the component cleaning of the single chamber.

Advantageous Effects of Invention

The means enables optimization of information necessary for identifying and calibrating a performance difference resulting from a temporal change of a single chamber, a performance difference resulting from component replacement or component cleaning of a single chamber, or a performance difference between different chambers, and simultaneous identification and calibration of an inter-chamber difference with a plurality of manufacturing condition parameters. Thereby, performance variations of semiconductor apparatuses manufactured by a semiconductor apparatus manufacturing apparatus can be inhibited, and homogenization of semiconductor apparatus performance can be enabled.

BRIEF DESCRIPTION OF DRAWINGS

FIG. 3 is a functional block diagram of the plasma processing apparatus diagnostic apparatus according to Example 1.

FIG. 8 is a figure depicting an example of a result obtained when template matching is implemented by using reference chamber feature quantity map data and a submap according to Example 1.

DESCRIPTION OF EMBODIMENTS

Figure 1:
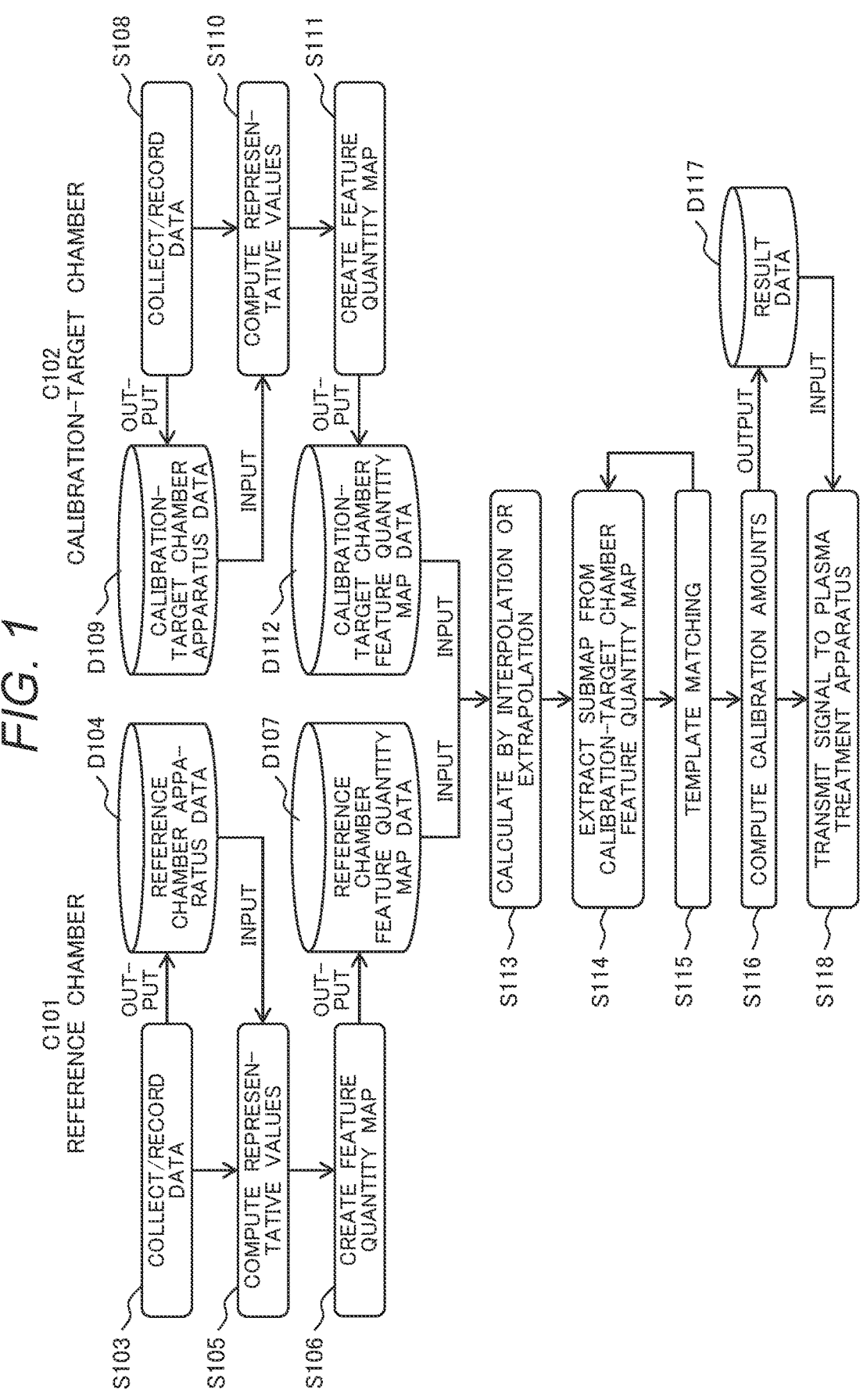
FIG. 1 is a flowchart in a case that the present invention is applied to a plasma processing apparatus diagnostic apparatus that performs identification and calibration of an inter-chamber difference using template matching in the image processing field.

Examples are explained below by using the figures. It should be noted that, in the following explanation, identical constituent elements are given identical reference characters, and repetitive explanations are omitted in some cases. Note that whereas the figures give schematic representations as compared to actual aspects in some cases in order to make the explanation clearer, the representations are merely examples, and do not limit the interpretation of the present invention.

Example 1

An apparatus diagnostic apparatus (302: refer to FIG. 3) according to Example 1 relates to a state monitoring and prediction system for a semiconductor processing apparatus (semiconductor apparatus manufacturing apparatus 201), and can optimize information necessary for identifying and calibrating a performance difference between different processing chambers (hereinafter, called chambers), a performance difference resulting from a temporal change of a single chamber, or a performance difference resulting from component replacement or component cleaning of a single chamber, and identify and calibrate an inter-chamber difference with a plurality of parameters.

Here, regarding a semiconductor apparatus manufacturing apparatus (first semiconductor apparatus manufacturing apparatus) (200) having a chamber treated as a reference (called a reference chamber), and a semiconductor apparatus manufacturing apparatus (second semiconductor apparatus manufacturing apparatus) (201) having a chamber treated as a calibration target (called a chamber which is a calibration target or a calibration-target chamber), a performance difference between different chambers is a performance difference between the reference chamber mounted on the first semiconductor apparatus manufacturing apparatus (200) and the chamber which is mounted on the second semiconductor apparatus manufacturing apparatus (201), and is the calibration target.

Performance differences are differences (performance differences: e.g., differences in etching amounts, differences in thicknesses of formed films) generated to processing results (e.g., etching, film formation) in a process using a reference chamber, and in a process using a chamber which is a calibration target. An example is that there is a performance difference between a plasma treatment using plasma generated in a reference chamber and a plasma treatment using plasma generated to a chamber which is a calibration target. The performance difference between the plasma treatment using plasma generated in the reference chamber, and the plasma treatment using plasma generated in the chamber which is the calibration target means a performance difference is generated between a semiconductor apparatus manufactured by using the semiconductor apparatus manufacturing apparatus having the reference chamber, and a semiconductor apparatus manufactured by using the semiconductor apparatus manufacturing apparatus having the calibration-target chamber. That is, the performance difference between the plasma treatment using plasma generated in the reference chamber, and the plasma treatment using plasma generated to the chamber which is the calibration target becomes a factor of performance variations between semiconductor apparatuses.

Regarding a chamber of the second semiconductor apparatus manufacturing apparatus (201), a performance difference resulting from a temporal change of the single chamber is a performance difference between the chamber (corresponding to a reference chamber) in a state before the temporal change (or a state with a small temporal change), and the reference chamber (corresponding to a chamber which is a calibration target) in a state after the temporal change.

Regarding a chamber of the second semiconductor apparatus manufacturing apparatus (201), a performance difference resulting from component replacement or component cleaning of the single chamber is a performance difference between the chamber (corresponding to a reference chamber) in a state before the component replacement or the component cleaning, and the chamber (corresponding to a chamber which is a calibration target) in a state after the component replacement or the component cleaning.

The apparatus diagnostic apparatus (302) according to the example is configured to identify a performance difference between different chambers, a performance difference resulting from a temporal change of a single chamber, or a performance difference resulting from component replacement or component cleaning of a single chamber, and perform calibration such that, by using an identified calibration amount, the performance of a chamber which is a calibration target becomes equivalent to the performance of a reference chamber. The apparatus diagnostic apparatus (302) transmits the identified calibration amount to the second semiconductor apparatus manufacturing apparatus (201).

Thereby, for example, in the chamber (the chamber which is the calibration target), the second semiconductor apparatus manufacturing apparatus (201) can generate plasma calibrated with the identified calibration amount. This inhibits variations of the performance of semiconductor apparatuses manufactured by the second semiconductor apparatus manufacturing apparatus (201), and enables homogenization of the performance of the semiconductor apparatuses.

Figure 2:
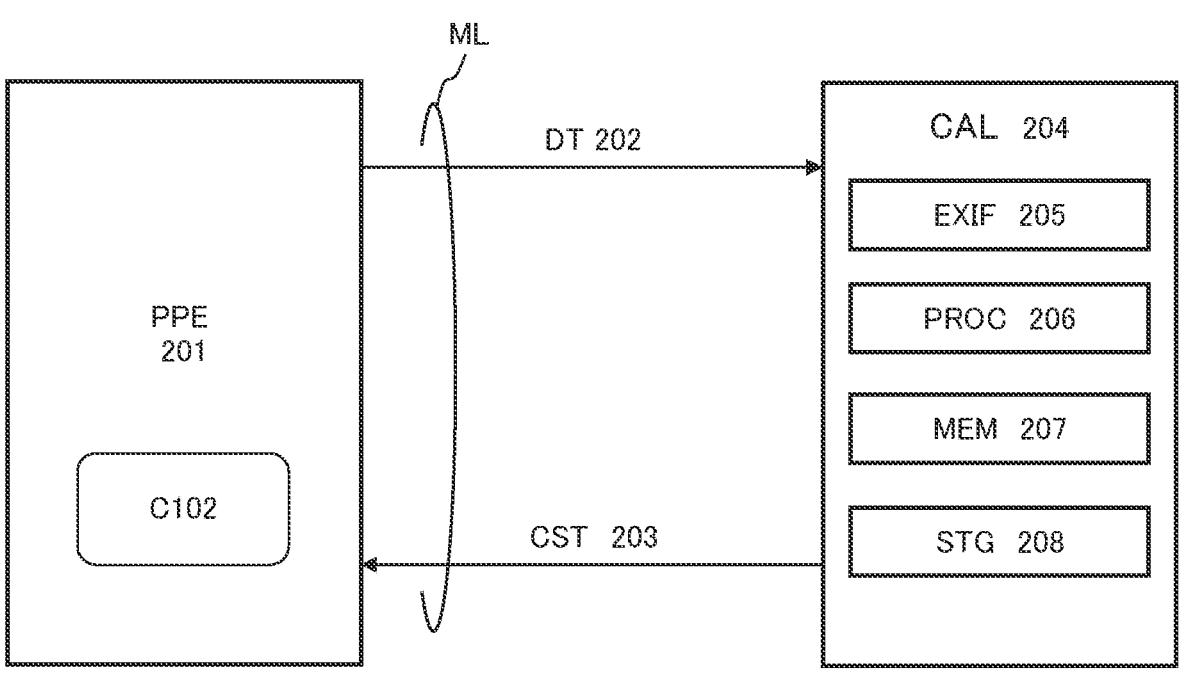
FIG. 2 is a hardware configuration diagram of a semiconductor apparatus manufacturing apparatus system including a plasma processing apparatus and the plasma processing apparatus diagnostic apparatus according to Example 1.

FIG. 1 is a flowchart in a case that the present invention is applied to a plasma processing apparatus diagnostic apparatus that performs identification and calibration of an inter-chamber difference using template matching in the image processing field. FIG. 2 is a figure depicting hardware configuration of a semiconductor apparatus manufacturing apparatus system including a plasma processing apparatus and the plasma processing apparatus diagnostic apparatus according to Example 1.

A semiconductor apparatus manufacturing apparatus system (semiconductor manufacturing apparatus system) 20 depicted in FIG. 2 includes a plasma processing apparatus (PPE) 201 and a calculator (CAL) 204. The depicted plasma processing apparatus (PPE) 201 is a semiconductor manufacturing apparatus (also referred to as a semiconductor apparatus manufacturing apparatus) used for manufacturing of semiconductor apparatuses. For example, the plasma processing apparatus 201 is a plasma etching apparatus, and has, implemented thereon, chambers (also referred to as processing chambers, reaction vessels, reaction chambers, or reaction furnaces) used for performing plasma treatments on semiconductor substrates. The calculator (CAL) 204 has an external IF (EXIF: also referred to as an external interface circuit) 205, a processor (PROC) 206, a memory (MEM) 207, and a storage (STG) 208. In this example, the external IF 205 of the calculator 204 is electrically connected with the plasma processing apparatus 201 by metal wires ML for transmission and reception of signals through a network line such as a LAN cable or a USB cable. The calculator 204 receives signal data at a time of a plasma treatment from various types of sensors mounted on the plasma processing apparatus 201 through the external IF 205 by data transfer (DT) 202, and transmits results of calculation by the calculator 204 to the plasma processing apparatus 201 through the external IF 205 by calibration signal transmission (CST) 203.

Figure 3:
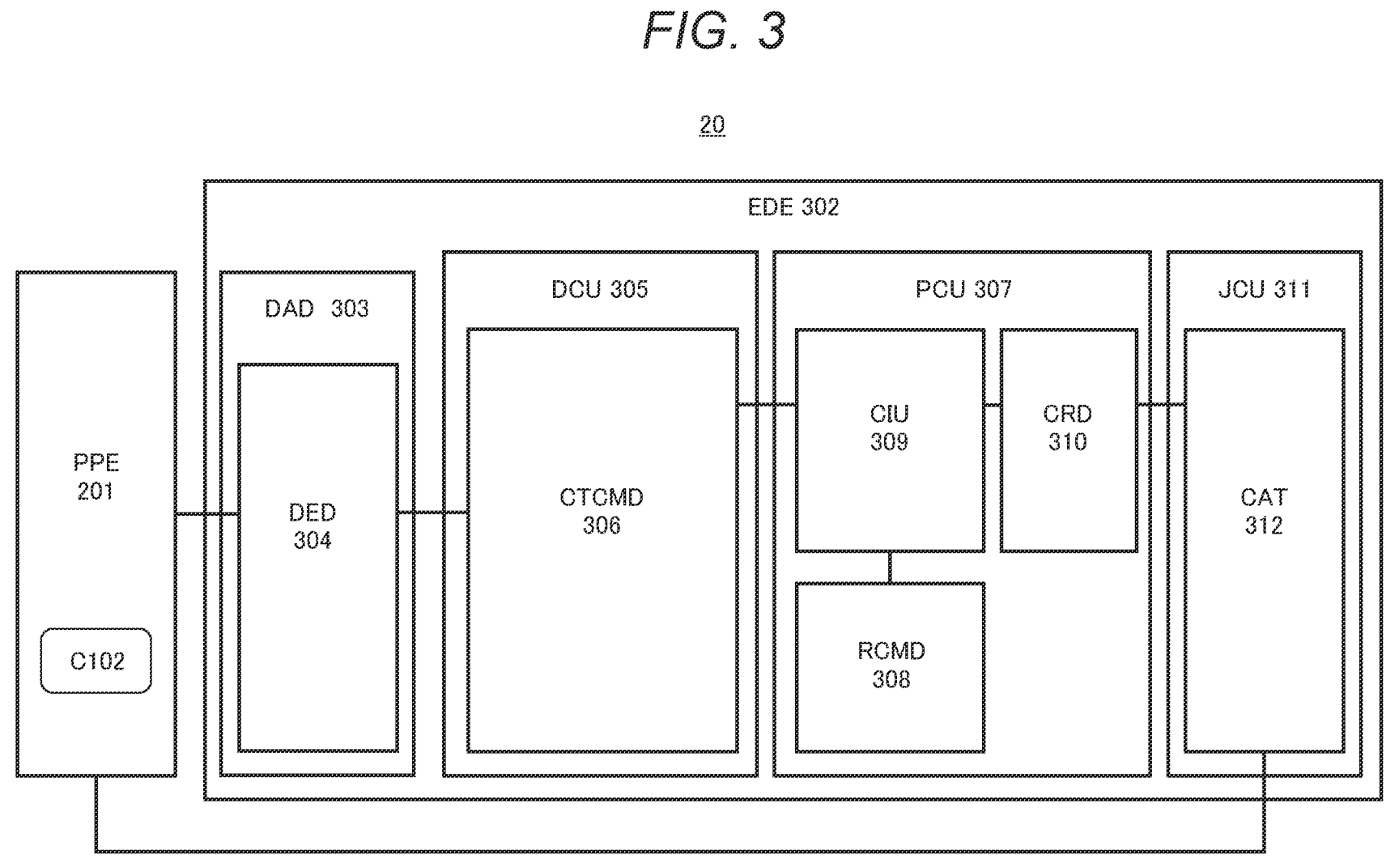

FIG. 3 is a figure depicting functional blocks of the plasma processing apparatus diagnostic apparatus according to Example 1. A plasma processing apparatus diagnostic apparatus (EDE: also referred to as an apparatus diagnostic apparatus or a diagnostic apparatus) 302 is implemented on the calculator 204. For example, the diagnostic apparatus 302 is configured to be realized by the calculator 204 when the processor 206 of the calculator 204 executes a software program that is stored on the storage 208, and realizes functionalities of the diagnostic apparatus 302. The diagnostic apparatus 302 may be configured as a hardware circuit to realize functionalities (303, 305, 307, and 311) mentioned later. The diagnostic apparatus 302 has a data collecting/recording section (DAD) 303, a data calibrating section (DCU) 305, an apparatus state prediction calculating section (PCU) 307, and a judging and control section (JCU: referred to as a judging/control section below) 311.

The data collecting/recording section (DAD) 303 has a functionality of receiving data transmitted by the data transfer 202, and storing the data as apparatus data (DED) 304 on the storage 208 in the calculator 204.

The data calibrating section (DCU) 305 has a functionality of converting the apparatus data 304 into calibration-target chamber feature quantity map data (CTCMD) 306.

The apparatus state prediction calculating section (PCU) 307 has a functionality of using the calibration-target chamber feature quantity map data 306 and the reference chamber feature quantity map data (RCMD) 308 to identify a calibration amount representing how much change of a recipe parameter which is a setting value of microwave intensity, a coil current, a pressure, radio frequency bias power or the like set at a time of a plasma treatment from a setting value of a calibration-target chamber is needed to make plasma treatment results of the calibration-target chamber and a reference chamber the same on the basis of patterns observed in the reference chamber feature quantity map data and the calibration-target chamber feature quantity map data. A recipe parameter calibration amount identifying section (CIU) 309 is a section that executes a calculation for determining the degree of a difference between the calibration-target chamber feature quantity map data 306 and the reference chamber feature quantity map data 308 in terms of the recipe parameter, and has a functionality of storing a calculation result as apparatus state prediction calculation result data (CRD) 310 on the storage 208.

The judging/control section (JCU) 311 has a functionality of creating, from the apparatus state prediction calculation result data 310, a telegraphic message to be transmitted to the plasma processing apparatus 201, and transmitting the telegraphic message. The calibration amount transmitting section (CAT) 312 has a functionality of transmitting the created telegraphic message to the plasma processing apparatus 201 via the external IF 205.

The flowchart in FIG. 1 depicts an algorithm executed by the diagnostic apparatus 302. Operation of the diagnostic apparatus 302 based on the flowchart in FIG. 1 is as follows.

First, the diagnostic apparatus 302 executes Steps S103, S105, and S106 at a reference chamber C101 to thereby create reference chamber feature quantity map data D107. The creation of the reference chamber feature quantity map data D107 may be executed by the diagnostic apparatus 302 as described before or may be executed by collecting/recording reference chamber apparatus data D104 by another method, storing the reference chamber apparatus data D104 on a storage of a calculator other than the calculator on which the diagnostic apparatus 302 is implemented, and executing Steps S103, S105 and S106 on the calculator.

When a timing at which chamber calibration is desired to be implemented has come, the diagnostic apparatus 302 executes Steps S108, S110, and S111 at a calibration-target chamber C102 to thereby create calibration-target chamber feature quantity map data D112.

The diagnostic apparatus 302 executes Steps S113, S114, and S115 by using the reference chamber feature quantity map data D107 and the calibration-target chamber feature quantity map data D112, identifies a calibration amount of the recipe parameter (Step S116, data D117), and at last transmits a signal to the plasma processing apparatus 201 (Step S118).

Thereby, the diagnostic apparatus 302 transmits the identified calibration amount as the signal to the plasma processing apparatus 201 via the external IF 205. The plasma processing apparatus 201 having received the identified calibration amount as the signal can calibrate various types of parameters of manufacturing conditions for generating plasma in the chamber on the basis of the identified calibration amount. Thereby, plasma for which calibration has been performed about a performance difference between different chambers, a performance difference resulting from a temporal change of a single chamber, or a performance difference resulting from component replacement or a component cleaning of a single chamber can be generated in the chamber of the plasma processing apparatus 201. This attains a unique advantageous effect of inhibiting variations of the performance of semiconductor apparatuses manufactured by the plasma processing apparatus 201, and enabling homogenization of the performance of the semiconductor apparatuses.

Here, the calibration-target chamber may be a chamber other than the reference chamber. Alternatively, the calibration-target chamber and the reference chamber may be a single chamber, but the former is in a state that has changed due to a lapse of time, component replacement or component cleaning.

Details of each step are as follows.

S103 (first step): At the reference chamber C101, plasma treatments are performed by generating plasma while changing, at particular intervals, a plurality of recipe parameter setting values in a particular value range, data related to the plasma generation situations at those times is collected by using various types of sensor mounted on the plasma processing apparatus (semiconductor apparatus manufacturing apparatus 200 or 201), and the data is stored as the reference chamber apparatus data D104.

S105 (second step): By using the reference chamber apparatus data D104, representative values of sensor values collected at times of the plasma treatments with the respective setting values of the plurality of recipe parameters that were changed at Step S103 are calculated. That is, a computation process is applied to the collected data (the reference chamber apparatus data D104), and a plurality of representative values of the plasma generation situations under the conditions of the plurality of manufacturing condition parameters are calculated.

S106 (third step, fourth step): From the representative values calculated at Step S105, the reference chamber feature quantity map data D107 is created, and stored. That is, a computation process is performed by using the plurality of representative values, and feature quantities are calculated (third step). Then, the calculated feature quantities are mapped on a graph with two or more dimensions having axes representing a plurality of manufacturing condition parameters, and the reference chamber feature quantity map data is created (fourth step).

S108 (fifth step): At the calibration-target chamber C102, by a method which is the same as the method at S103, plasma treatments are performed by generating plasma while changing, at particular intervals, a plurality of recipe parameter setting values in a particular value range, data related to the plasma generation situations at those times is collected by using various types of sensor mounted on the plasma processing apparatus (semiconductor apparatus manufacturing apparatus) 201, and the data is stored as calibration-target chamber apparatus data D109.

S110 (sixth step): By using the calibration-target chamber apparatus data D109, and by a method which is the same as the method at Step S105, representative values of sensor values collected at times of the plasma treatments with the respective setting values of the plurality of recipe parameters that were changed at S108 are calculated.

S111 (seventh step, eighth step): By using the representative values calculated at Step S110, and by a method which is the same as the method at Step S106, the calibration-target chamber feature quantity map data D112 is created, and stored. That is, a computation process is performed by using the plurality of representative values, and feature quantities are calculated (seventh step). Then, the calculated feature quantities are mapped on a graph with two or more dimensions having axes representing a plurality of manufacturing condition parameters, and the calibration-target chamber feature quantity map data D112 is created (eighth step).

S113: In a case that the numbers of data points of the reference chamber feature quantity map data D107 and the calibration-target chamber feature quantity map data D112 are small, interpolation or extrapolation is performed.

S114: A partial area of the calibration-target chamber feature quantity map data D112 is extracted as a submap.

S115: Template matching is implemented by using the submap extracted at Step S114 and the reference chamber feature quantity map data, and it is checked which position on the reference chamber feature quantity map data the submap matches.

A loop process of Steps S114 and S115 is performed to implement template matching by using a plurality of submaps, and a plurality of results are acquired.

S116: From the acquired plurality of template matching results, final calibration amounts are decided (identified), and stored as result data (also referred to as calibration amount data) D117. That is, at Steps S113 to S116 (ninth step), on the basis of patterns observed in the reference chamber feature quantity map data and the calibration-target chamber feature quantity map data, a performance difference between different chambers, a performance difference resulting from a temporal change of a single chamber, or a performance difference resulting from component replacement or component cleaning of a single chamber is identified. The identified final calibration amounts are stored as the result data D117.

S118 (tenth step): Content to be transmitted to the plasma processing apparatus 201 is decided, and transmitted.

Figure 4:
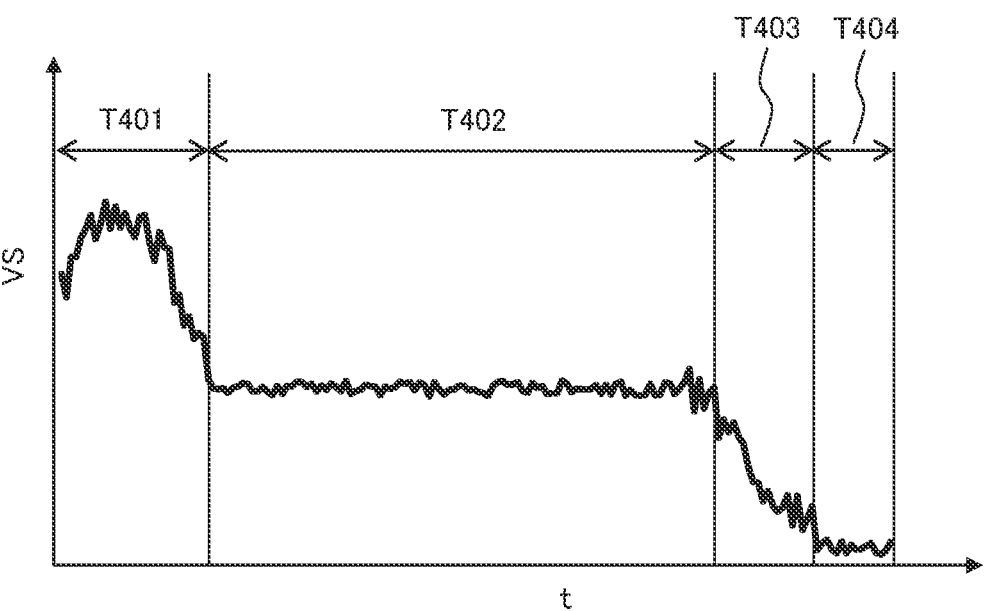
FIG. 4 is a figure depicting an example of time-series data of sensor values acquired from the plasma processing apparatus according to Example 1.

FIG. 4 depicts an example of time-series data of sensor values acquired from the plasma processing apparatus according to Example 1. FIG. 4 depicts an example of time-series data of each sensor value of the apparatus data 304 acquired at Steps S103 and S108. In FIG. 4, the vertical axis represents sensor values (VS), and the horizontal axis represents time (t). Here, a period T401 represents a transitory state area immediately after recipe parameters are set, a period T402 represents a steady area, periods T403 and T404 represent areas immediately before the end of a plasma treatment. At Steps S105 and S110, representative value computations on time-series data like the one in FIG. 4 are implemented for each sensor. Here, as the representative values, statistical data such as averages or standard deviations of the time-series data in a particular temporal area may be used, or sensor values at a certain time may be used.

Figure 5:
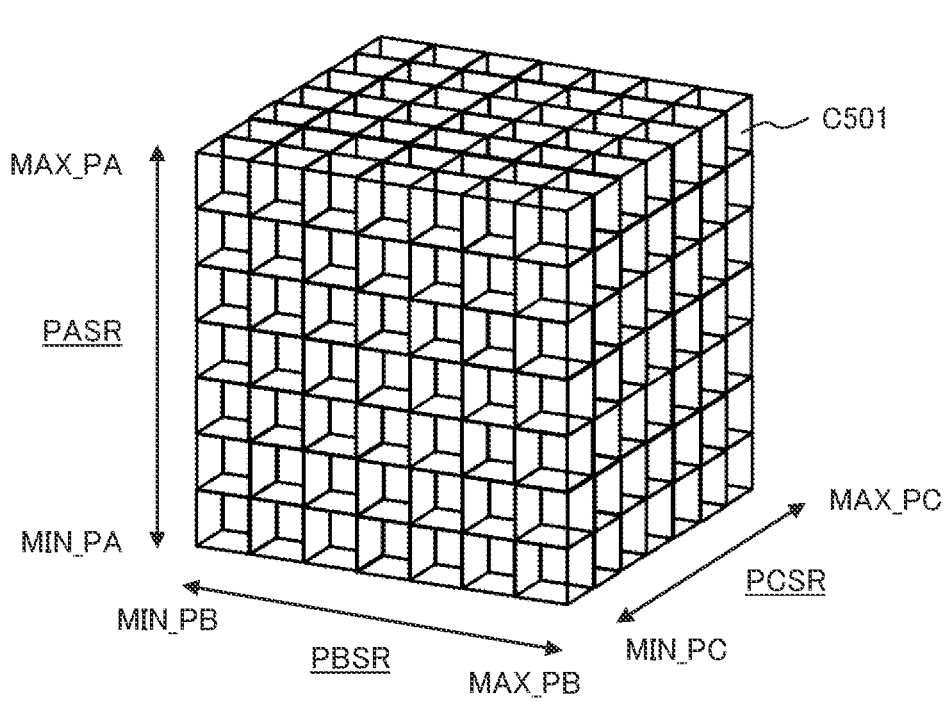
FIG. 5 is a figure depicting an example of a feature quantity map data format according to the present invention.
Figure 6:
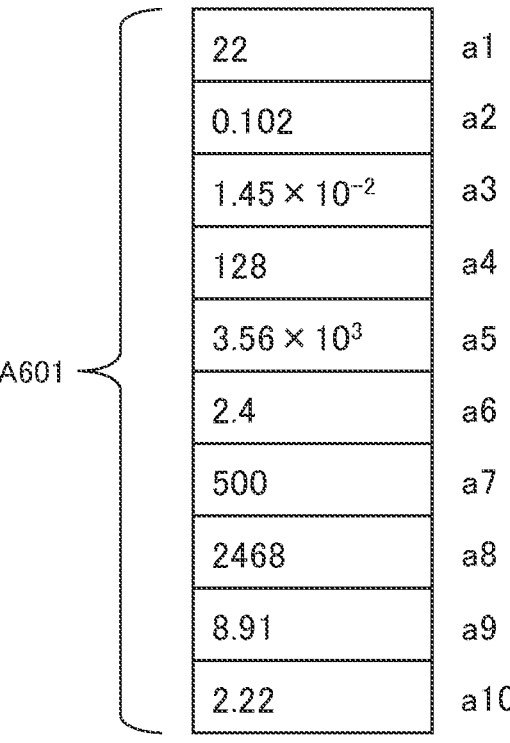
FIG. 6 is a figure depicting an example of data stored on cells of feature quantity map data according to the present invention.

FIG. 5 is a figure depicting an example of a feature quantity map data format according to the present invention. FIG. 6 is a figure depicting an example of data stored on cells of the feature quantity map data according to the present invention.

FIG. 5 depicts three-dimensional feature quantity map data 3DMP as an example of feature quantity map data created at Steps S106 and S111. In the feature quantity map data 3DMP, the height direction, the width direction and the depth direction are associated with setting values of mutually different recipe parameters A (PA), B (PB), and C (PC). That is, the recipe parameters A (PA), B (PB), and C (PC) are represented by axes of a plurality of manufacturing condition parameters. The height direction of the feature quantity map data 3DMP depicted in FIG. 5 represents a settable range PASR from the minimum value (MIN_PA) to the maximum value (MAX_PA) of the recipe parameter A (PA). The width direction of the feature quantity map data 3DMP represents a settable range PBSR from the minimum value (MIN_PB) to the maximum value (MAX_PB) of the recipe parameter B (PB). The depth direction of the feature quantity map data 3DMP represents a settable range PCSR from the minimum value (MIN_PC) to the maximum value (MAX_PC) of the recipe parameter C (PC). The recipe parameters A, B, and C are the plurality of recipe parameters changed at Step S103, S108 and, for example, the recipe parameter A can be microwave intensity, the recipe parameter B can be coil current and the recipe parameter C can be pressure. The recipe parameters A, B and C are not limited to these, but other parameters can also be used.

Here, one small cube C501 represents a plasma treatment condition which serves as certain setting values of the recipe parameters A, B, and C. FIG. 6 represents array data A601 retained inside the one small cube C501 in FIG. 5. The array data (feature quantity array) A601 is an array of ten feature quantities (a1 to a10), in this example.

At Steps S106 and S111, feature quantities are calculated by using representative values calculated under each setting condition of the recipe parameters, and sequentially stored on the feature quantity map data 3DMP in FIG. 5 as feature quantity arrays inside small cubes at positions to which the setting conditions of the recipe parameters correspond. Here, as a method of calculating feature quantities from representative values, the feature quantities may be calculated by implementing four arithmetic operations by using a plurality of representative values, or the representative values may be used as feature quantities with no changes being made thereto. In addition, as final feature quantities, a value obtained by implementing a conversion such as normalization on each element in the feature quantity array by using values in all small cubes of the feature quantity map data 3DMP, and may be stored in a feature quantity array. In elements in the feature quantity array (a1 to a10) in FIG. 6, for example, a coil voltage, a magnetron current, a valve opening and the like are stored as feature quantities. The present process can be imaged easily if it is considered as being a process similar to a process of associating luminance information of R, G, and B with pixel positions in an image. By this process, it becomes possible to apply an image processing solution method to the problem of chamber matching. In addition, even if feature quantities have a tendency of changing depending on the recipe parameters A, B, and C, it becomes possible to simultaneously estimate the values of the recipe parameters A, B, and C from obtained values of the feature quantities. Whereas the three-dimensional feature quantity map data 3DMP is illustrated as an example in the present example here, similar advantageous effects can be attained if the number of dimensions is equal to or greater than two.

Figure 7:
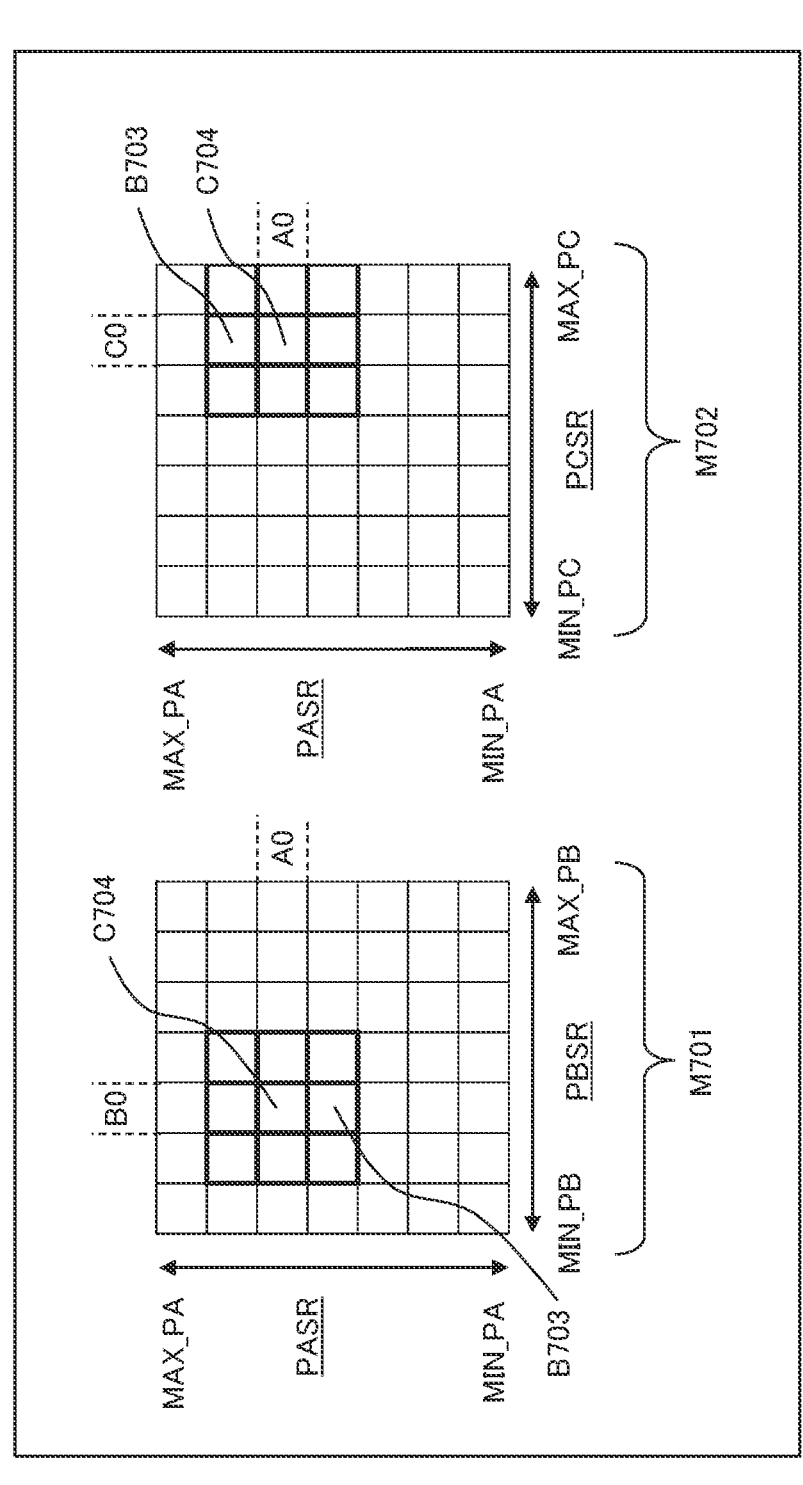
FIG. 7 is a figure depicting an example of submap extraction from calibration-target chamber feature quantity map data according to Example 1.

FIG. 7 is a figure depicting an example of submap extraction from the calibration-target chamber feature quantity map data according to Example 1. FIG. 7 depicts a two-dimensional map M701, and two-dimensional map M702 which are the feature quantity map data 3DMP in FIG. 5 as seen from the front side and from above, respectively. At Step S114, an area B703 surrounded by the bold line in FIG. 7 is extracted as a submap from the calibration-target chamber feature quantity map data D112, which is the data format in FIG. 5. Thereby, the submap B703 is three-dimensional feature quantity map data having the size of 3×3×3 whose central small cube C704 has recipe parameter setting values (A0, B0, C0). Here, in a case that the calibration-target chamber feature quantity map data D112 has been subjected to interpolation or extrapolation at S113, the submap is extracted from the calibration-target chamber feature quantity map data after the interpolation or extrapolation process. In addition, the size of the extracted submap B703 is not limited to 3×3×3, but, for example, the submap B703 may be a three-dimensional map having a size like 3×4×5, a two-dimensional map having a size like 3×4×1, or a one-dimensional map having a size like 1×1×3.

Figure 8:
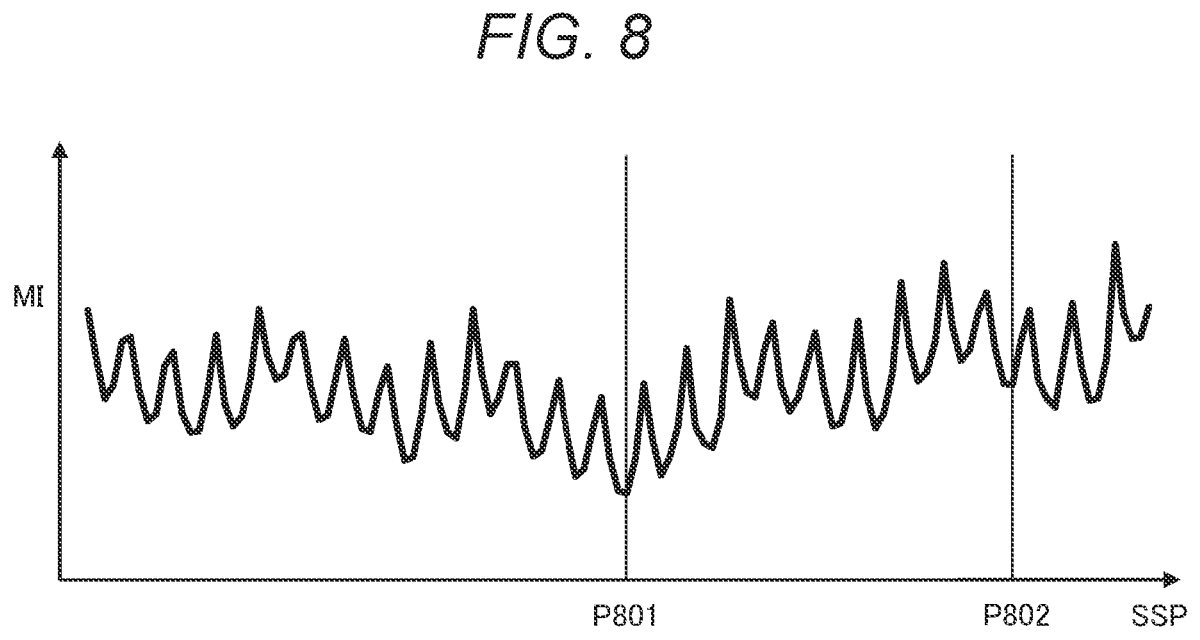

FIG. 8 is a figure depicting an example of a result obtained when template matching is implemented by using the reference chamber feature quantity map data and a submap according to Example 1. FIG. 8 depicts a result of implementation of template matching by using the reference chamber feature quantity map data and the submap B703 extracted at Step S114. In FIG. 8, the vertical axis represents matching indices (MI), and the horizontal axis represents submap scanning positions (SSP) on the reference chamber feature quantity map data. In the template matching implemented at Step S115, scanning is performed on the reference chamber feature quantity map data D107 by using the submap B703 extracted at Step S114, and a matching index (MI) is calculated at each scanning position (SSP), and a result like the one in FIG. 8 is obtained. Here, in a case that the reference chamber feature quantity map data D107 has been subjected to interpolation or extrapolation at S113, scanning is performed on the reference chamber feature quantity map data after the interpolation or extrapolation process by using a submap extracted from the calibration-target chamber feature quantity map data after the interpolation or extrapolation process. In addition, a scanning position P801 where the minimum matching index MI is observed in FIG. 8 is a point (matching point) where the values of the feature quantity array of the submap B703 and the feature quantity array of the reference chamber feature quantity map data D107 at the scanning position P801 are closest to each other.

A scanning position P802 represents a scanning position on the reference chamber feature quantity map data D107 which is the same as an area on the calibration-target chamber feature quantity map data D112 where the submap B703 depicted in FIG. 7 is extracted. In a case that there is not an inter-chamber difference between the reference chamber C101 and the calibration-target chamber C102, the minimum matching index MI is supposed to be observed at the scanning position P802. Accordingly, the difference between the scanning positions P801 and P802 is a calibration amount that is desired to identify in chamber matching. If setting values of the recipe parameters A, B, C of the central small cube C704 of the submap B703 at the scanning position P801 are expressed as (A1, B1, C1), setting values of the recipe parameters A, B, and C of the central small cube C704 of the submap B703 at the scanning position P802 are (A0, B0, C0) in accordance with FIG. 5, so the calibration amounts ($V_A$, $V_B$, $V_C$) that are desired to be identified between the reference chamber C101 and the calibration-target chamber C102 are computed in accordance with the following Mathematical Formula 1.

$$(V_A, V_B, V_C){=}(A0{-}A1, B0{-}B1, C0{-}C1) \quad \text{(Mathematical Formula 1)}$$

Here, matching indices used may be indices like Sum of Absolute Difference (SAD) or Sum of Squared Difference (SSD), or may be indices like Normalized Cross Correlation (NCC) or Zero-mean Normalized Cross Correlation (ZNCC). In addition, whereas a scanning position where the minimum matching index is observed is decided as the matching point in the method here, for example, a method like one in which the matching point is decided precisely by performing fitting using a regression model in an area near the minimum matching index may be implemented.

After Steps S114 and S115 are completed for one submap (B703), the process returns to Step S114 again, another submap is extracted from an area other than the submap B703 in the calibration-target chamber C102, template matching is implemented again at Step S115, and a calibration amount is identified. Template matching is implemented by use various (a plurality of) submaps in this manner, and calibration amounts are identified.

At Step S116, final calibration amounts are computed by average value calculations on a plurality of calibration amounts obtained when Steps S114 and S115 are implemented repeatedly as described before, and a plurality of template matching results and calibration amount identification results obtained by repeating Steps S114 and S115 are stored as the result data D117. Here, only results with values of matching indices at matching points which are equal to or lower than a particular threshold may be chosen from the plurality of template matching results obtained by repeating Steps S114 and S115. Only highly reliable matching points may be collected by doing a process like this, and final calibration amounts may be computed by average value calculations on those matching points. In addition, whereas the average is determined as the final calibration amount here, for example, a final calibration amount computation may be implemented by implementing a median calculation or a mode calculation.

At Step S118, the content of a telegraphic message to be transmitted to the plasma processing apparatus 201 is decided from the result data D117, and the content of the telegraphic message is transmitted to the plasma processing apparatus 201 though the external IF 205. Here, the calibration amount computed at Step S116 may be transmitted as a telegraphic message, or, in a case that any of the absolute values of calibration amounts of the recipe parameters is equal to or greater a threshold, content prompting component replacement associated with the recipe parameter may be transmitted as a telegraphic message. In addition, in a case that highly reliable matching point information could not be obtained at Step S116, content representing a template matching failure may be transmitted as a telegraphic message.

Figure 9:
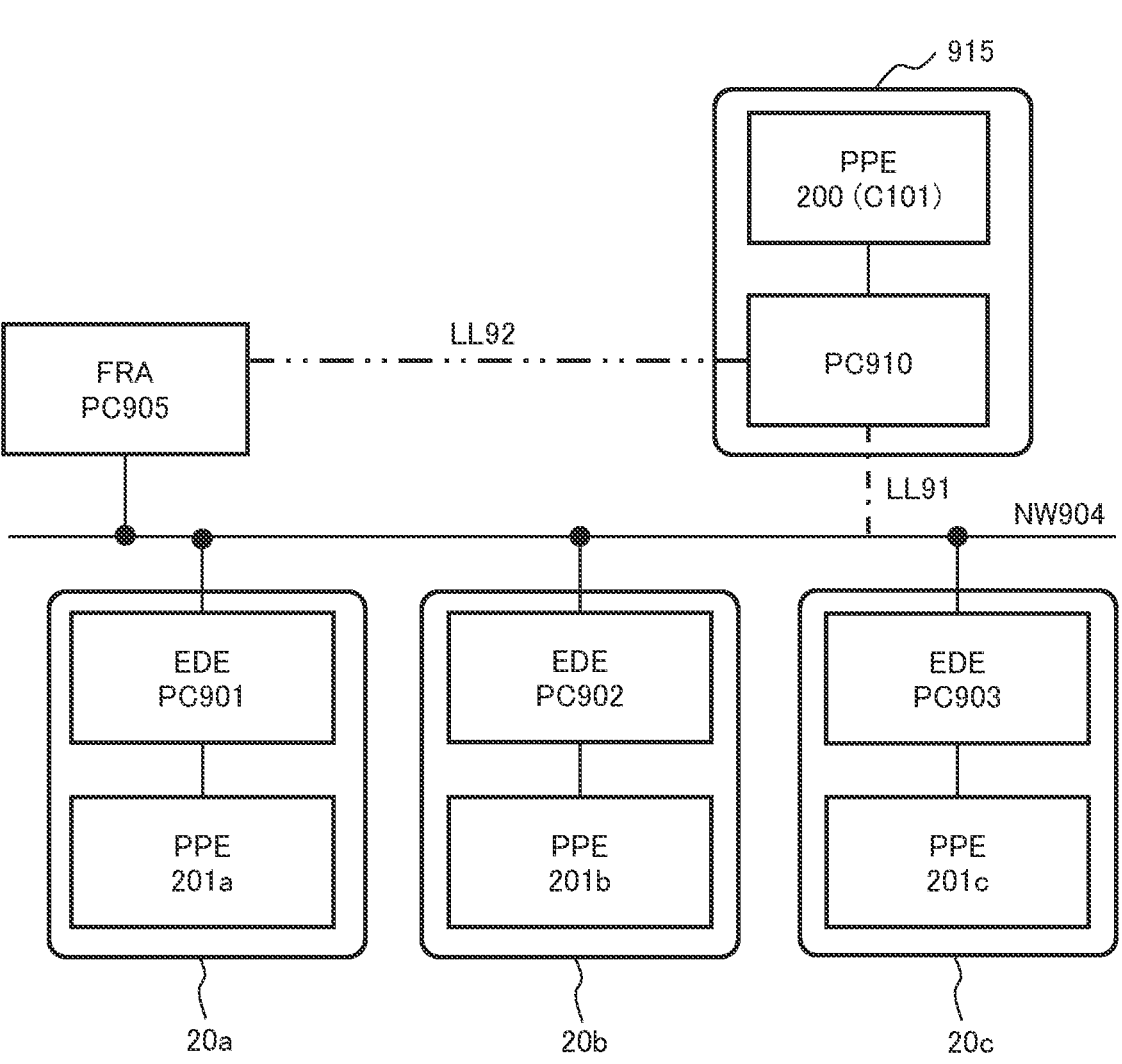
FIG. 9 is an overall configuration diagram of a semiconductor apparatus manufacturing system according to Example 1, and is a network configuration diagram of plasma processing apparatuses, plasma processing apparatus diagnostic apparatuses, and a prediction result aggregating apparatus included in the semiconductor apparatus manufacturing system.

FIG. 9 is an overall configuration diagram of a semiconductor apparatus manufacturing system according to Example 1, and is a figure depicting a network configuration diagram of plasma processing apparatuses, plasma processing apparatus diagnostic apparatuses, and a prediction result aggregating apparatus included in the semiconductor apparatus manufacturing system. FIG. 9 is a network configuration diagram of plasma processing apparatus diagnostic apparatuses (EDE) PC901, PC902, and PC903 connected to plasma processing apparatuses (PPE) 201*a*, 201*b* and 201*c*, and a prediction result aggregating apparatus (FRA) PC905 that performs aggregation of prediction results of the plurality of plasma processing apparatus diagnostic apparatuses PC901, PC902, and PC903.

As depicted in FIG. 9, a semiconductor apparatus manufacturing system 900 has semiconductor apparatus manufacturing apparatus systems (semiconductor manufacturing apparatus systems) 20*a*, 20*b*, and 20*c*, the prediction result aggregating apparatus (FRA) PC905, and a network NW904 connecting the semiconductor apparatus manufacturing apparatus systems 20*a*, 20*b*, and 20*c* and the prediction result aggregating apparatus PC905. As explained in FIG. 2 and FIG. 3, the semiconductor apparatus manufacturing apparatus system 20*a* has the plasma processing apparatus (PPE) 201*a* and the plasma processing apparatus diagnostic apparatus (EDE) PC901. Similarly, the semiconductor apparatus manufacturing apparatus system 20*b* has the plasma processing apparatus (PPE) 201*b* and the plasma processing apparatus diagnostic apparatus (EDE) PC902. The semiconductor apparatus manufacturing apparatus system 20*c* has the plasma processing apparatus (PPE) 201*c* and the plasma processing apparatus diagnostic apparatus (EDE) PC903.

Here, the plasma processing apparatuses (201*a*, 201*b*, and 201*c*) can correspond to second semiconductor apparatus manufacturing apparatuses. On the other hand, a plasma processing apparatus (PPE) 200 mentioned later can correspond to a first semiconductor apparatus manufacturing apparatus.

Each plasma processing apparatus 201*a*, 201*b*, or 201*c* is connected with a corresponding one of the plasma processing apparatus diagnostic apparatuses PC901, PC902, and PC903, respectively. Each of the plasma processing apparatus diagnostic apparatuses PC901, PC902 and PC903 is the plasma processing apparatus diagnostic apparatus (EDE)

302 depicted in FIG. 3. For example, the plasma processing apparatus diagnostic apparatuses PC901, PC902, and PC903 are connected to the network NW904 using communication lines like LAN cables. Furthermore, the prediction result aggregating apparatus PC905 is connected to the network NW904.

The prediction result aggregating apparatus PC905 aggregates state prediction results of the plasma processing apparatuses (201a, 201b, 201c) calculated at the corresponding plasma processing apparatus diagnostic apparatuses PC901, PC902, and PC903.

According to the semiconductor manufacturing apparatus system 900 included in a network like the one depicted in FIG. 9, it becomes possible for engineers to monitor and compare the state of each plasma processing apparatus (201a, 201b, 201c) simply by accessing the prediction result aggregating apparatus PC905. In addition, for example, it becomes possible also to distribute the reference chamber feature quantity map data D107 to the plasma processing apparatus diagnostic apparatuses PC901, PC902, and PC903 from the prediction result aggregating apparatus PC905.

That is, the reference chamber feature quantity map data D107 is created by a plasma processing apparatus diagnostic apparatus PC910 connected to the plasma processing apparatus (PPE) 200 including the reference chamber C101. The created reference chamber feature quantity map data D107 can be transmitted from the plasma processing apparatus diagnostic apparatus PC910 to the prediction result aggregating apparatus PC905, and stored on the prediction result aggregating apparatus PC905, in this configuration. It is also possible to consider that the plasma processing apparatus diagnostic apparatus PC910 executes Steps S103, S105, and S106. Here, the reference chamber apparatus data D104 may be collected/recorded by another method without using the plasma processing apparatus diagnostic apparatus PC910, the reference chamber apparatus data D104 may be stored on a storage of a calculator other than the plasma processing apparatus diagnostic apparatus PC910, and Steps S103, S105, and S106 may be executed to create the reference chamber feature quantity map data D107 on the calculator other than the plasma processing apparatus diagnostic apparatus PC910. In a case that the reference chamber feature quantity map data D107 is created without using the plasma processing apparatus diagnostic apparatus PC910 in this manner, instead of the method of storing the reference chamber feature quantity map data D107 on the prediction result aggregating apparatus PC905 by transmission from the plasma processing apparatus diagnostic apparatus PC910 to the prediction result aggregating apparatus PC905, for example, the reference chamber feature quantity map data D107 may be stored on a portable storage, the portable storage may be connected to the prediction result aggregating apparatus PC905, and the reference chamber feature quantity map data D107 may be copied from the portable storage to the prediction result aggregating apparatus PC905 to thereby store the reference chamber feature quantity map data D107 on the prediction result aggregating apparatus PC905.

A semiconductor apparatus manufacturing apparatus system 915 including the plasma processing apparatus (PPE) 200 and the plasma processing apparatus diagnostic apparatus PC910 may be configured such that the plasma processing apparatus diagnostic apparatus PC910 is connected to the network NW904 as represented by a dash-dotted line LL91 in FIG. 9. Alternatively, the plasma processing apparatus diagnostic apparatus PC910 may not be connected to the network NW904, but, as represented by a two-dot chain line LL92 in FIG. 9, the plasma processing apparatus diagnostic apparatus PC910 may be configured to be connected to the prediction result aggregating apparatus PC905 by another network. Note that in a case that the reference chamber feature quantity map data D107 is stored on the prediction result aggregating apparatus PC905, the semiconductor apparatus manufacturing apparatus system 915 may not be connected to the prediction result aggregating apparatus PC905. Note that in a case that updating work of the reference chamber feature quantity map data D107 occurs, the semiconductor apparatus manufacturing apparatus system 915 and the prediction result aggregating apparatus PC905 are electrically connected by a network, preferably.

In addition, the semiconductor manufacturing apparatus system 900 depicted in FIG. 9 can be considered as a semiconductor apparatus manufacturing system including a platform which is connected to the semiconductor manufacturing apparatuses (201a, 201b, 201c) via the network NW904, and on which an application for identifying inter-processing chamber performance differences of the semiconductor manufacturing apparatuses (201a, 201b, 201c) is implemented. Then, a step of determining a feature quantity of data collected from the semiconductor manufacturing apparatuses (201a, 201b, 201c), a step of creating feature quantity map data by mapping the feature quantity onto a graph with two or more dimensions having axes representing manufacturing condition parameters of the semiconductor manufacturing apparatuses (201a, 201b, 201c), and a step of identifying a performance difference on the basis of the created feature quantity map data are executed by the application. The application is stored on the memory (MEM) 207 or the storage (STG) 208 in FIG. 2, and executed by the processor (PROC) 206.

Example 2

The present Example 2 relates to a feature quantity optimization method of choosing feature quantities with high identification precision in identification of an inter-chamber performance difference about feature quantities stored in the reference chamber feature quantity map data D107 and the calibration-target chamber feature quantity map data D112 in Example 1.

Figure 10:
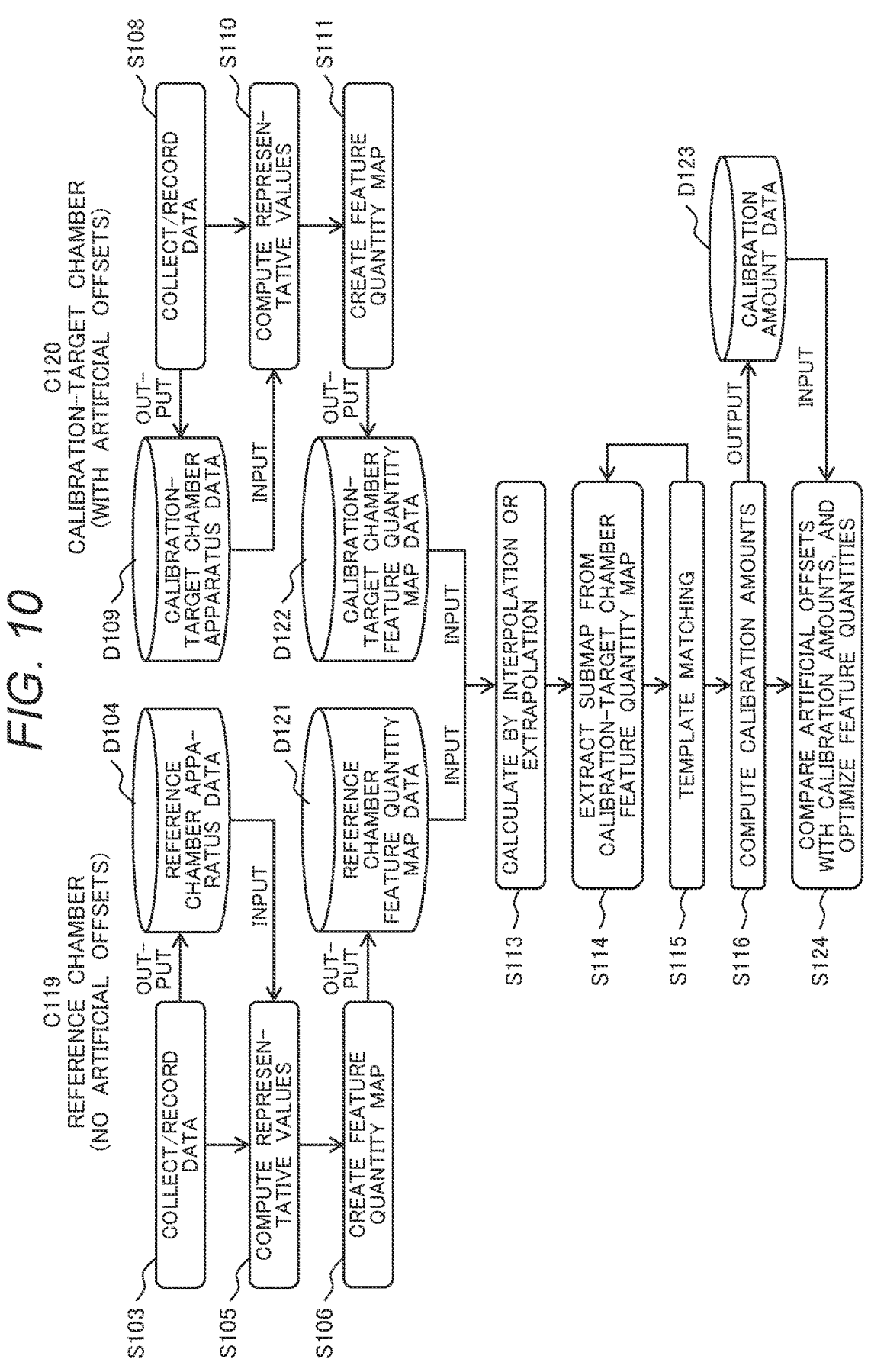
FIG. 10 is a flowchart depicting optimization of feature quantities used in template matching according to Example 2.

FIG. 10 is a flowchart according to the present Example 2. The flowchart in FIG. 10 is a feature quantity optimization algorithm for an inter-chamber difference calibration executed by the diagnostic apparatus 302. In FIG. 10, constituent elements that are given reference characters that are identical to their counterparts in FIG. 1 represent the same steps or data with the same formats as their counterparts in FIG. 1. That is, S103, D104, S105, S106, S108, D109, S110, S111, and S113 to S116 in FIG. 10 are the same as their counterparts in FIG. 1, and D121, D122, D123, S124 in FIG. 10 are data and a step which are changes from FIG. 1. Only the step which is a change from FIG. 1 is depicted below.

Regarding the relationship between a reference chamber C119 and a calibration-target chamber C120, they are a single chamber, and have little or no temporal change. By editing internal control parameters of the plasma processing apparatus 201, artificial offsets are generated to recipe parameters which are calibration amount identification targets of the calibration-target chamber C120. On the other hand, internal control parameters of the plasma processing apparatus 201 are not edited, and artificial offsets are not generated to recipe parameters which are calibration amount identification targets of the reference chamber C119.

Reference chamber feature quantity map data D121 and calibration-target chamber feature quantity map data D122 are data retaining, as elements in feature quantity arrays, all candidate feature quantities that may be used in template matching.

Step S124: By using calibration amount data D123 as result data at a time when template matching is implemented on all the candidate feature quantities, feature quantity optimization is implemented by comparing calibration amounts calculated from artificial offsetting with calibration amounts identified by template matching. That is, by comparing performance differences calculated from the artificially generated offset values with identified performance differences, feature quantities that give smaller differences therebetween are chosen as optimized feature quantities. Optimized feature quantities can be chosen and used by such a feature-quantity optimization technique. By using the chosen optimum feature quantities in the algorithm depicted in FIG. 1, highly precise calibration amount data can be identified. The highly precise calibration amount data is used as the content of a telegraphic message transmitted to the plasma processing apparatus 201 at Step S118 in the algorithm in FIG. 1. The content of the telegraphic message is transmitted from the external IF 205 of the diagnostic apparatus 302 (see FIG. 3) to the plasma processing apparatus 201.

That is, in order to highly precisely identify a performance difference between different chambers, a performance difference resulting from a temporal change of a single chamber, or a performance difference resulting from component replacement or component cleaning of a single chamber, the apparatus diagnostic apparatus (302) according to Example 2 implements optimization of feature quantities. By using feature quantities chosen by the optimization in Example 2 for the apparatus diagnostic apparatus (302) according to Example 1, it becomes possible to highly precisely identify a performance difference between different chambers, a performance difference resulting from a temporal change of a single chamber, or a performance difference resulting from component replacement or component cleaning of a single chamber, and calibration is performed such that, by using an identified highly precise calibration amount, the performance of a chamber which is a calibration target becomes equivalent to the performance of a reference chamber. The apparatus diagnostic apparatus (302) transmits the identified highly precise calibration amount as a telegraphic message to the second semiconductor apparatus manufacturing apparatus (201).

Thereby, plasma for which calibration has been performed about a performance difference between different chambers, a performance difference resulting from a temporal change of a single chamber or a performance difference resulting from component replacement or a component cleaning of a single chamber can be generated in the chamber of the plasma processing apparatus 201. This attains a unique advantageous effect of inhibiting variations of the performance of semiconductor apparatuses manufactured by the plasma processing apparatus 201, and enabling homogenization of the performance of the semiconductor apparatuses.

Figure 11:
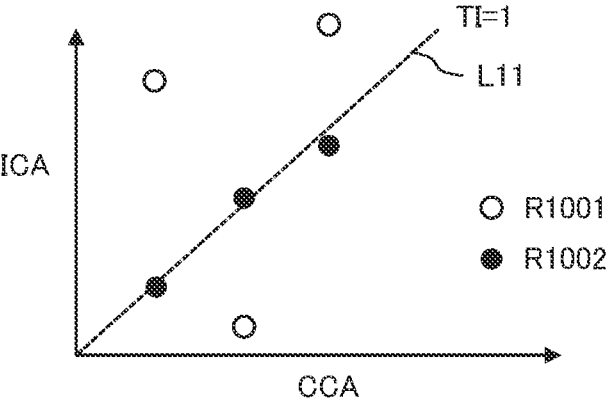
FIG. 11 is a graph depicting comparison between calibration amounts calculated from artificial offsetting and calibration amounts identified by template matching according to Example 2.

FIG. 11 is a graph on which the calibration amount data D123 is plotted, with the horizontal axis representing calibration amounts (CCA) calculated by giving offsets to recipe parameters artificially, and the vertical axis representing calibration amounts (ICA) identified by template matching. Results R1001 displayed with white circles are calibration amount data identified when invalid feature quantities are used, and results R1002 displayed with black circles are calibration amount data identified when valid feature quantities are used. In addition, on the graph of FIG. 11, the slope (TI) of a dotted line L11 is 1 (TI=1). At Step S124 in FIG. 10, optimization is implemented by treating, as valid feature quantities, feature quantities with small differences between calibration amounts calculated from artificial offsetting by using such results, and calibration amounts identified by template matching. As an optimization technique, feature quantities that give the coefficients of determination which are close to 1 may be chosen by using identified calibration amounts as predicted values, or searches for optimum feature quantities may be implemented by using a machine learning technique.

A summary of features of the apparatus diagnostic apparatus according to the present invention is as follows.

1) An apparatus diagnostic apparatus in which an inter-processing chamber (chamber) performance difference of a semiconductor manufacturing apparatus is identified, in which a feature quantity of data collected from the semiconductor manufacturing apparatus is determined, feature quantity map data is created by mapping the feature quantity onto a graph with two or more dimensions having axes representing manufacturing condition parameters of the semiconductor manufacturing apparatus, and the performance difference is identified on the basis of the created feature quantity map data.

2) The apparatus diagnostic apparatus according to 1) described above, in which the performance difference is identified by applying template matching to the feature quantity map data.

3) The apparatus diagnostic apparatus according to 1) described above, in which the performance difference includes a performance difference between different processing chambers, a performance difference resulting from a temporal change of a single processing chamber, and a performance difference resulting from component replacement or component cleaning of a single processing chamber.

4) The apparatus diagnostic apparatus according to 1) described above, in which a calibration amount of the parameters corresponding to the identified performance difference is determined.

5) The apparatus diagnostic apparatus according to 1) described above, in which the semiconductor manufacturing apparatus is a plasma etching apparatus.

6) A semiconductor manufacturing apparatus system including the apparatus diagnostic apparatus according to 1) described above including a semiconductor manufacturing apparatus connected via a network.

7) A semiconductor apparatus manufacturing system including a platform which is connected to a semiconductor manufacturing apparatus via a network, and on which an application for identifying an inter-processing chamber performance difference of the semiconductor manufacturing apparatus is implemented, in which the application executes:

a step of determining a feature quantity of data collected from the semiconductor manufacturing apparatus, a step of creating feature quantity map data by mapping the feature quantity onto a graph with two or more dimensions having axes representing manufacturing condition parameters of the semiconductor manufacturing apparatus, and a step of identifying the performance difference on the basis of the created feature quantity map data.

8) An apparatus diagnosis method for identifying an inter-processing chamber performance difference of a semiconductor manufacturing apparatus, the apparatus diagnosis method including:

a step of determining a feature quantity of data collected from the semiconductor manufacturing apparatus, a step of creating feature quantity map data by mapping the feature quantity onto a graph with two or more dimensions having axes representing manufacturing condition parameters of the semiconductor manufacturing apparatus, and a step of identifying the performance difference on the basis of the created feature quantity map data.

9) The apparatus diagnostic apparatus according to 8) described above, in which the performance difference includes a performance difference between different processing chambers, a performance difference resulting from a temporal change of a single processing chamber, and a performance difference resulting from component replacement or component cleaning of a single processing chamber.

REFERENCE SIGNS LIST 20, 20a, 20b, 20c . . . semiconductor apparatus manufacturing apparatus system (semiconductor manufacturing apparatus system)
200 . . . plasma processing apparatus (first semiconductor apparatus manufacturing apparatus)
201, 201a, 201b, 201c . . . plasma processing apparatus (second semiconductor apparatus manufacturing apparatus)
302, PC901, PC902, PC903 . . . plasma processing apparatus diagnostic apparatus (apparatus diagnostic apparatus)
D107, D121 . . . reference-target chamber feature quantity map data
D112, D122 . . . calibration-target chamber feature quantity map data
PC905 . . . prediction result aggregating apparatus
C101, C119 . . . reference chamber
C102, C120 . . . calibration-target chamber
900 . . . semiconductor apparatus manufacturing system

The invention claimed is:

1. An apparatus diagnostic apparatus in which an inter-processing chamber performance difference of a semiconductor manufacturing apparatus is identified, comprising:

a processor; and a memory coupled with the processor, wherein the processor is configured to determine a feature quantity of data collected from the semiconductor manufacturing apparatus;

create a feature quantity map data by mapping the feature quantity onto a graph with two or more dimensions having axes representing manufacturing condition parameters of the semiconductor manufacturing apparatus; and identify the performance difference on the basis of the created feature quantity map data, wherein the graph is divided into cells corresponding to the manufacturing condition parameters for each setting value of the manufacturing condition parameters, and the mapped feature quantities are stored in the cells corresponding to the manufacturing condition parameters for the feature quantities.

2. The apparatus diagnostic apparatus according to claim 1, wherein the performance difference is identified by applying template matching to the feature quantity map data.

3. The apparatus diagnostic apparatus according to claim 1, wherein the performance difference includes a performance difference between different processing chambers, a performance difference resulting from a temporal change of a single processing chamber, and a performance difference resulting from component replacement or component cleaning of a single processing chamber.

4. The apparatus diagnostic apparatus according to claim 1, wherein a calibration amount of the parameters corresponding to the identified performance difference is determined.

5. The apparatus diagnostic apparatus according to claim 1, wherein the semiconductor manufacturing apparatus is a plasma etching apparatus.

6. A semiconductor manufacturing apparatus system comprising the apparatus diagnostic apparatus according to claim 1 including a semiconductor manufacturing apparatus connected via a network.

7. The apparatus diagnostic apparatus according to claim 1, wherein the cell stores array data of the feature quantities.

8. A semiconductor apparatus manufacturing system comprising:

a platform which is connected to a semiconductor manufacturing apparatus via a network, wherein the platform comprises a processor and a memory coupled with the processor on which application program instructions are stored for identifying an inter-processing chamber performance difference of the semiconductor manufacturing apparatus, wherein the application program instructions cause the processor to executes: operations comprising a step of determining a feature quantity of data collected from the semiconductor manufacturing apparatus;

a step of creating feature quantity map data by mapping the feature quantity onto a graph with two or more dimensions having axes representing manufacturing condition parameters of the semiconductor manufacturing apparatus; and a step of identifying the performance difference on the basis of the created feature quantity map data, and wherein the graph is divided into cells corresponding to the manufacturing condition parameters for each setting value of the manufacturing condition parameters, and the mapped feature quantities are stored in the cells corresponding to the manufacturing condition parameters for the feature quantities.

9. An apparatus diagnosis method for identifying an inter-processing chamber performance difference of a semiconductor manufacturing apparatus, the apparatus diagnosis method comprising:

a step of determining a feature quantity of data collected from the semiconductor manufacturing apparatus, a step of creating feature quantity map data by mapping the feature quantity onto a graph with two or more dimensions having axes representing manufacturing condition parameters of the semiconductor manufacturing apparatus, and a step of identifying the performance difference on the basis of the created feature quantity map data, wherein the graph is divided into cells corresponding to the manufacturing condition parameters for each setting value of the manufacturing condition parameters, and the mapped feature quantities are stored in the cells corresponding to the manufacturing condition parameters for the feature quantities.

10. The apparatus diagnosis method according to claim 9, wherein the performance difference includes a performance difference between different processing chambers, a performance difference resulting from a temporal change of a single processing chamber, and a performance difference resulting from component replacement or component cleaning of a single processing chamber.

\* \* \* \* \*